United States Patent
Zheng et al.

(10) Patent No.: US 9,170,306 B2
(45) Date of Patent: Oct. 27, 2015

(54) ISLANDING DETECTION METHOD AND SYSTEM

(71) Applicants: BOE TECHNOLOGY GROUP CO., LTD., Beijing (CN); BEIJING BOE ENERGY TECHNOLOGY CO., LTD, Beijing (CN)

(72) Inventors: Ping Zheng, Beijing (CN); Ming Cui, Beijing (CN); Peng Zhao, Beijing (CN); Xuyang Wang, Beijing (CN); Peihuan Yang, Beijing (CN)

(73) Assignees: BOE Technology Group Co., Ltd., Beijing (CN); Beijing BOE Energy Technology Co., Ltd., Beijing (CN)

( * ) Notice: Subject to any disclaimer, the term of this patent is extended or adjusted under 35 U.S.C. 154(b) by 276 days.

(21) Appl. No.: 13/876,914

(22) PCT Filed: Nov. 6, 2012

(86) PCT No.: PCT/CN2012/084168
§ 371 (c)(1),
(2) Date: Apr. 3, 2013

(87) PCT Pub. No.: WO2014/000359
PCT Pub. Date: Jan. 3, 2014

(65) Prior Publication Data
US 2014/0078625 A1    Mar. 20, 2014

(30) Foreign Application Priority Data

Jun. 29, 2012  (CN) .......................... 2012 1 0227000

(51) Int. Cl.
*G01R 31/40* (2014.01)
*H02J 3/38* (2006.01)

(52) U.S. Cl.
CPC ............... *G01R 31/40* (2013.01); *H02J 3/383* (2013.01); *H02J 2003/388* (2013.01); *Y02E 10/563* (2013.01)

(58) Field of Classification Search
USPC ........... 307/30, 129; 324/76.74, 527; 361/20, 361/21; 702/60; 318/558; 700/286, 292
See application file for complete search history.

(56) References Cited

U.S. PATENT DOCUMENTS 6,853,940 B2 * 2/2005 Tuladhar ....................... 702/111
7,015,597 B2 * 3/2006 Colby et al. .................... 307/31

(Continued)

FOREIGN PATENT DOCUMENTS

| CN | 102255329 A | 11/2011 |
|---|---|---|
| CN | 102262182 A | 11/2011 |
| CN | 102723735 A | 10/2012 |

OTHER PUBLICATIONS

Second Office Action issued by the Chinese Patent Office for Chinese Patent Application No. 201210227000.6 dated Jul. 22, 2014, 6pgs.

(Continued)

*Primary Examiner* — Bentsu Ro

(57) ABSTRACT

The present invention provides an islanding detection method and an islanding detection system. The method includes: acquiring a voltage signal at a grid-connected node of a power generation system, and extracting phase information of the voltage signal; constructing a slip-mode frequency shift islanding detection curve in the form of a quadratic function according to the phase information; and generating a disturbance signal according to the slip-mode frequency shift islanding detection curve, and sending the disturbance signal to an inverter of the power generation system. The method and system can avoid a non-detection zone, and can perform an inverter islanding detection in a fast and accurate manner under simple control.

19 Claims, 2 Drawing Sheets

(56) References Cited

U.S. PATENT DOCUMENTS

| | | | |
|---|---|---|---|
| 7,138,728 B2 * | 11/2006 | LeRow et al. | 307/30 |
| 7,745,956 B2 * | 6/2010 | Ito et al. | 307/86 |
| 2006/0146582 A1 | 7/2006 | Lin et al. | |
| 2014/0078625 A1 | 3/2014 | Zheng et al. | |

OTHER PUBLICATIONS

English translation of Second Office Action issued by the Chinese Patent Office for Chinese Patent Application No. 201210227000.6 dated Jul. 22, 2014, 5pgs.

Long et al., Islanding Detection for PV Grid-connected System Based on Improved Slip-mode Frequency Shift, Electrical Measurement & Instrumentation, Jun. 2012, pp. 52-56, vol. 49, No. 558.

Furong et al., Non-Detection Zone of Slip-Mode Frequency Shift Method, Transactions of China Electrotechnical Society, Feb. 2009, pp. 178-182, vol. 24, No. 2.

First Chinese Office Action for Chinese Patent Application No. 201210227000.6 dated Jan. 30, 2014, 3pgs.

English translation of First Chinese Office Action for Chinese Patent Application No. 201210227000.6 dated Jan. 30, 2014, 1pg.

International Search Report for International Application No. PCT/CN2012/084168, 13pgs.

* cited by examiner

ISLANDING DETECTION METHOD AND SYSTEM

TECHNICAL FIELD

The present invention relates to an islanding detection method and system.

BACKGROUND

As a component in a photovoltaic power generation system, a grid-connected photovoltaic inverter is used to convert direct current (DC) from solar panels into alternating current (AC) which has the same phase and the same frequency as grid voltage, and to feed the AC to a power grid. When the power grid interrupts power supply for some reason, the inverter still transmits electrical energy to the grid. The inverter and local load form a self-supply island that cannot be controlled by a public grid system, which is also known as an islanding phenomenon. If there is no islanding detection or protection technique, the inverter will provide power supply to the local load and a local grid load continuously. The grid-connected photovoltaic (PV) power generation system in an islanding running state will result in serious consequences including: the power grid cannot control the voltage and frequency of the island; if the voltage and frequency exceed permitted ranges, it may cause damage to users' devices; if the load capacity is larger than the capacity of the PV power generation system, the PV power generation system will be in an overload running state which can be easily burned; live lines connected with the PV power generation system will decrease the security of the grid and are dangerous to maintenance personnel; reclosing operation of the island will cause line tripping and may cause damage to the PV power generation system and other equipments. It can be seen that inverters that are designed to have fast and accurate response function of islanding detection can reduce the harm of islanding.

Current islanding detection methods mainly include passive detection method and proactive detection method. Passive detection is to detect islanding effect by the variation of the voltage, frequency, phase or harmonic wave at the output of the inverter when the grid interrupts supply. This detection method determines islanding phenomenon mainly by an over/under-voltage and over/under-frequency detection method, and stops the inverter's grid-connected operation when a voltage-amplitude and a frequency at the node of common coupling (PCC) exceed normal ranges. When the inverter is operating, operational ranges of the voltage and the frequency should be reasonably set. If a voltage or a frequency offset reaches a preset threshold of the islanding detection, an islanding phenomenon may be detected. However, when the local load of the inverter closely matches the output power of the inverter, the offsets of the voltage and the frequency are very small or even zero, therefore, the passive detection method has a large non-detection zone (blind zone) and it fails for systems with good load matching.

The proactive detection method is to control the inverter to make certain disturbances to its output power, frequency or phase. When the grid is in normal operation, these disturbances can not be detected because of the balancing effect of the grid. Once the grid fails, disturbances output from the inverter accumulate quickly and exceed permitted ranges, thereby triggering islanding detection circuit. Such a method, which has a high detection accuracy and a small non-detection zone, requires complicated control and reduces quality of the power from the inverter.

SUMMARY

An object of embodiments of the present invention is to provide an islanding detection method and system, which can avoid non-detection zones, is under simple control, and can perform islanding detection of the inverter in a fast and accurate manner.

In order to settle the problem above-described, the embodiments of the present invention provide solutions as follows. An islanding detection method includes: acquiring a voltage signal at a grid-connected node of a power generation system, and extracting phase information of the voltage signal; constructing a slip-mode frequency shift (SMS) islanding detection curve in the form of quadratic function based on the phase information; and generating a disturbance signal based on the slip-mode frequency shift islanding detection curve, and sending the disturbance signal to an inverter of the power generation system.

For example, the slip-mode frequency shift islanding detection curve constructed in the form of quadratic function is as follows:

$$\theta = \Delta f(a|\Delta f|+b), -M \leq \theta \leq M$$

wherein $\theta$ is the phase of the disturbance signal, $\Delta f = f - f_g$, $f_g$ is a rated frequency of a power grid, f is the frequency of a currently acquired voltage signal, M is the preset maximum amplitude of the disturbance signal, a and b are preset parameters.

For example, a generated disturbance signal is as follows:

$$(\omega t)' = \omega t + \theta$$

wherein $\omega t$ is extracted phase information, $(\omega t)'$ is the generated disturbance signal, $\theta$ is the phase of the disturbance signal.

For example, $f_g = 50$ Hz.

For example, the detection method further includes: obtaining a voltage peak and a frequency based on the acquired voltage signal and the extracted phase information; if the voltage peak of the voltage signal at the grid-connected node exceeds a preset voltage range or if the frequency of the voltage signal at the grid-connected node exceeds a preset frequency range, cutting off a connection between the inverter of the power generation system and a local load.

For example, the preset voltage range is [0.8V, 1.2V], and the preset frequency range is [49.5 Hz, 50.5 Hz].

An islanding detection system includes: an acquisition module adapted to acquire a voltage signal at a grid-connected node of a power generation system and to extract phase information of the voltage signal; an islanding detection module adapted to construct a slip-mode frequency shift (SMS) islanding detection curve in the form of quadratic function based on the phase information; and a drive module adapted to generate a disturbance signal based on the SMS islanding detection curve and send the disturbance signal to an inverter of the power generation system.

For example, the SMS islanding detection curve constructed by the islanding detection module in the form of quadratic function is as follows:

$$\theta = \Delta f(a|\Delta f|+b), -M \leq \theta \leq M$$

wherein $\theta$ is the phase of the disturbance signal, $\Delta f = f - f_g$, $f_g$ is a rated frequency of a power grid, f is the frequency of a currently acquired voltage signal, M is the preset maximum amplitude of the disturbance signal, a and b are preset parameters.

For example, a disturbance signal generated by the drive module based on the SMS islanding detection curve is as follows:

$$(\omega t)' = \omega t + \theta$$

wherein $\omega t$ is extracted phase information, $(\omega t)'$ is the generated disturbance signal, $\theta$ is the phase of the disturbance signal.

For example, the islanding detection module is further adapted to make a decision based on a voltage peak and a frequency that are obtained according to the acquired voltage signal and the extracted phase information, and if the voltage peak of the voltage signal at the grid-connected node exceeds a preset voltage range or if the frequency of the voltage signal at the grid-connected node exceeds a preset frequency range, the islanding detection module is further adapted to cut off a connection between the inverter of the power generation system and a local load.

For example, the acquisition module includes a sensor, a conditioning circuit and a phase-locked loop, which are serially connected.

BRIEF DESCRIPTION OF THE DRAWINGS

In order to clearly illustrate the technical solution of the embodiments of the invention, the drawings of the embodiments will be briefly described as follows. It is obvious that the described drawings are only related to some embodiments of the invention and thus are not limitative of the invention.

DETAILED DESCRIPTION

In order for the above object, characteristic and advantage of the embodiments of this invention to be clearer, hereinafter the technical solutions of the embodiments of this invention are further explained clearly and completely in combination with the accompanying drawings. It is obvious that the described embodiments are just a part but not all of the embodiments of the invention. Based on the described embodiments herein, those skilled in the art can obtain other embodiment(s), without any inventive work, which should be within the scope of the invention.

The method and system provided in the present invention use a combination method of active and passive detection methods to perform an islanding detection of the grid-connected inverter, which mainly use a slip-mode frequency shift (abbreviated as SMS) detection method of the proactive detection method. As a proactive islanding detection method, a SMS detection method controls the output current of an inverter to introduce a disturbance with a small phase shift, which results in a phase difference between the output current and the voltage of the grid-connected node. Due to the clamping effect of the grid, when the inverter is connected to the grid, the output current of the inverter has the same phase as the voltage of the grid, the output frequency of the inverter is kept stable and has the same frequency as the grid. When the grid fails, while the inverter is operating under the condition that the local load matches well, the inverter and the local load forms an islanding system. At this time, the disturbance of the SMS-based proactive islanding detection enables the phase angle and the frequency to form a positive feedback, which causes variation of frequency of the output current of the inverter and variation of the voltage at the grid-connected node, and the islanding detection is based on the variation of frequency and voltage. When the variation triggers an over/under-voltage or over/under-frequency failure, the connection between the inverter and the local load is cut off. The method and the system provided in the present invention construct a SMS curve in the form of quadratic function, enable a positive feedback between the output frequency and the phase information of the inverter by adjusting control parameters when islanding phenomenon happens, which further triggers an over/under-voltage or over/under-frequency failure, and cut off the connection between the inverter and the local load based on the failure to make the inverter stop supplying power to the load, thus improving the security of the photovoltaic power generation system.

Photovoltaic power generation system is to be used as an example below to illustrate the techniques of the present invention which is not limitative of the invention, and other power generation system such as a wind power generation system can still use the techniques of the present invention.

Figure 1:
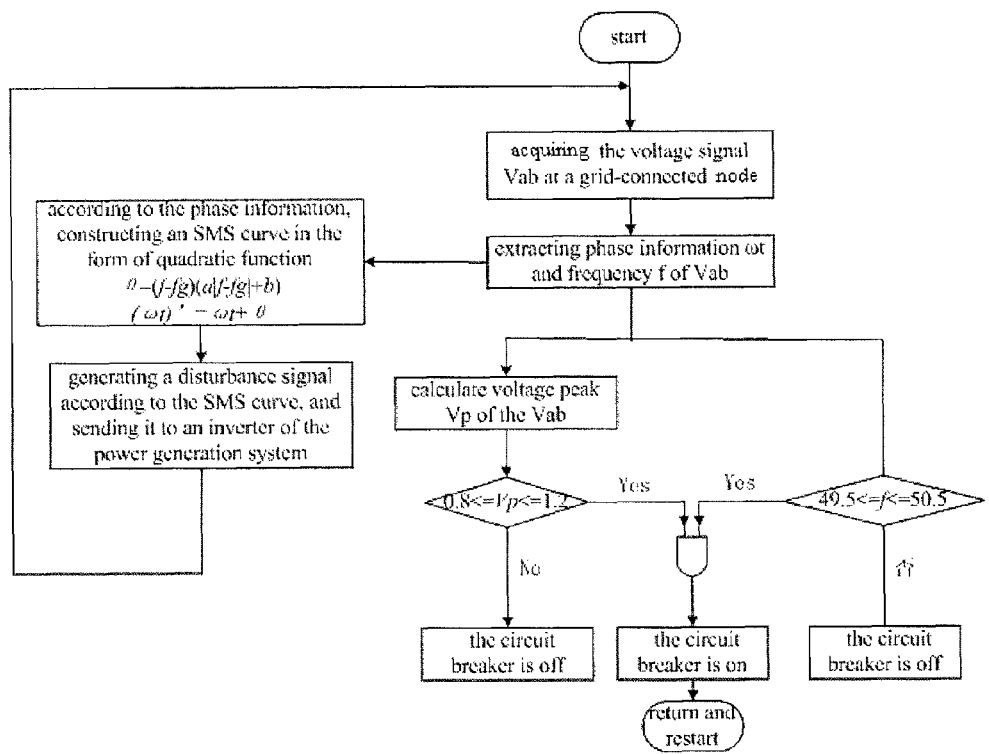
FIG. 1 is a flow chart of an islanding detection method according to an embodiment of the present invention.

As shown in FIG. 1, an islanding detection method of grid-connected photovoltaic inverter provided in an embodiment of the present invention includes:

acquiring the voltage signal at a grid-connected node of a photovoltaic power generation system, and extracting phase information, wherein the grid-connected node is a node where inverter output signal after filtering processing or other processing is connected to the grid and the local load;

constructing an SMS curve in the form of quadratic function based on phase information $\omega t$ and frequency f of the voltage signal at the grid-connected node; and generating a disturbance signal based on the SMS curve and sending the disturbance signal to the inverter of the photovoltaic power generation system.

It should be noted that the islanding detection is a continuous process carried out in real time, i.e. the present invention generates a disturbance signal according to a SMS curve based on a voltage signal that are acquired at a previous time and the phase information and the frequency of this voltage signal, sends the generated disturbance signal to the inverter, and then acquires in the next cycle a voltage signal that is disturbed, the phase information and the frequency of this voltage signal and performs a detection, and such a cyclic process continues.

As shown in FIG. 1, the islanding detection method according to the embodiment of the present invention can further include: making a decision according to the acquired voltage signal at the grid-connected node and the extracted phase information and frequency, i.e., if the voltage peak (Vp) of the currently acquired voltage signal at the grid-connected node exceeds a preset voltage range (over/under-voltage threshold), or if the frequency of the current voltage signal at the grid-connected node exceeds a preset frequency range (over/under-frequency threshold), the connection between the inverter in the photovoltaic power generation system and the local load will be cut off. Such a cutting-off process is carried out by a circuit breaker. For another example, the voltage peak Vp can be calculated by existing methods in this field based on the phase information extracted from the voltage signal at the grid-connected node.

For example, according to the connected grid voltage and frequency thereof, a preset voltage range is [0.8V, 1.2V], and a preset frequency range is [49.5 Hz, 50.5 Hz].

Figure 2:
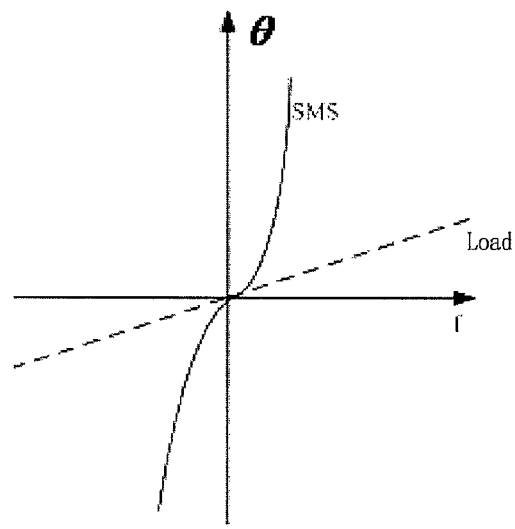
FIG. 2 is an illustrative diagram of the relation between a load curve and an SMS curve generated by the islanding detection method according to an embodiment of the present invention.

For example, the method of the embodiment as shown in FIG. 1 use a new SMS curve constructed in the form of quadratic function as follows.

$$\theta = \Delta f(a|\Delta f| + b), -M \leq \theta \leq M \quad (1)$$

wherein $\theta$ is the phase of the disturbance signal, $\Delta f = f - f_g$, $f_g$ is a rated frequency of the power grid, such as 50 Hz or 60 Hz, f is the frequency of the currently acquired voltage signal, M is the preset maximum amplitude (limit amplitude value) of the disturbance signal, a, b, and M are all preset parameters. The generated SMS curve is a quadratic curve, the relation between the SMS curve and the load curve being shown in FIG. 2. As shown in FIG. 2, the slope of the SMS quadratic curve constructed by the method in the embodiment as shown in FIG. 1 is larger than that of the load curve. When the islanding phenomenon occurs, the phase information and the frequency of the inverter output signal form a positive feedback until an over/under-voltage or over/under-frequency protection is triggered.

The three parameters a, b and M can be preset according to the required detection time (the detection time is defined as a time period from a time when islanding phenomenon occurs to a time of a break-off of the circuit breaker). The larger are the values of a and b, the shorter is the detection time. M affects the harmonic component of the output current of inverter, which should be set within the range that enables the harmonic component of the output current of the inverter to meet requirements.

The disturbance signal $(\omega t)'$ generated according to the SMS curve is:

$$(\omega t)' = \omega t + \theta \quad (2)$$

wherein $\omega t$ is the extracted phase information, $(\omega t)'$ is the generated disturbance signal, $\theta$ is the phase of the disturbance signal.

Figure 3:
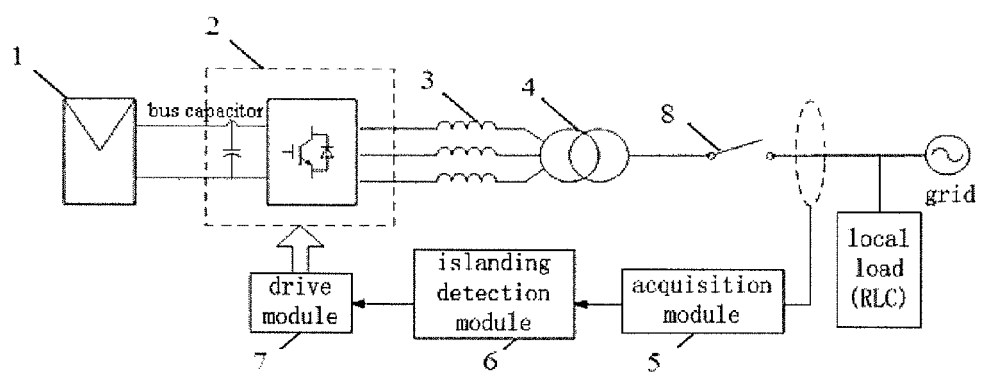
FIG. 3 is a block diagram showing the combination of a conventional photovoltaic power generation system and an islanding detection system according to an embodiment of the present invention.

FIG. 3 illustrates a structure diagram of the combination of a conventional photovoltaic power generation system and an islanding detection system provided in an embodiment of the present invention. As shown in FIG. 3, the conventional photovoltaic power generation system includes a photovoltaic panel 1, an inverter 2, a filter 3 and a transformer 4. The output of the transformer 4 is connected with the power grid and the local load (RLC), the connection node being the grid-connected node. According to an embodiment of the present invention, the islanding detection system includes: an acquisition module 5, an islanding detection module 6 and a drive module 7.

For example, the acquisition module 5 includes but not limited to: a sensor, a conditioning circuit and a phase-locked loop which are serially connected. The acquisition module 5 acquires the voltage signal Vab at the grid-connected node (the dashed oval frame in the figure) of the photovoltaic power generation system by the sensor, and after the processing conducted by the conditioning circuit, the phase-locked loop extracts phase information $\omega t$ and the frequency f of the voltage signal; and the output of the phase-locked loop is the input of the islanding detection module 6. For example, the phase-locked loop is implemented in a digital signal processor (DSP).

Based on the input from the acquisition module 5, the islanding detection module 6 calculates a target phase $\theta$ of the disturbance signal according to the equation (1), and constructs a SMS curve in the form of above quadratic function. For example, the phase-locked loop in the acquisition module 5 and the islanding detection module 6 can be implemented in the same DSP, or the islanding detection module 6 can be implemented by other means.

The drive module 7 generates a final disturbance signal according to the SMS curve and the equation (2), sends the disturbance signal to the inverter 2 of the photovoltaic power generation system, and simultaneously drives the inverter 2 to output corresponding current, which enables the phase information and the frequency of the proactive islanding detection disturbance to form a positive feedback.

The islanding detection module 6 detects a occurrence of islanding phenomenon in real time. When an over/under-voltage or an over/under-frequency fault triggered by variation of the voltage at the grid-connected node or variation of the frequency (the variations being caused by islanding) occurs, the circuit breaker 8 is disconnected, which cuts off the connection between the inverter 2 and the local load; thus the inverter 2 stops supplying power to the load side until the power grid recovers.

In an embodiment of the present invention, the drive module 7 uses pulse width modulation (PWM) to generate disturbance signals. For example, conventional PWM circuits can be used to generate disturbance signals.

The method and system provided in the present invention adopt a combination method of proactive and passive detection methods, which can avoid non-detection zone. The control of the combination method is simple and the inverter islanding detection can be executed in a fast and accurate way. In addition, the combination method constructs the SMS curve in the form of quadratic function according to the frequency of the currently sampled voltage signal at the grid-connected node, which takes less CPU resources during the operation of the method, thus facilitating the development of embedded systems. Further, the combination method includes simple calculations and can obtain required detecting response time by setting of the relevant parameters.

What are described above is related to the illustrative embodiments of the disclosure only and not limitative to the scope of the disclosure; the scopes of the disclosure are defined by the accompanying claims.

The invention claimed is:

1. An islanding detection method, comprising:
acquiring a voltage signal at a grid-connected node of a power generation system, and extracting phase information of the voltage signal;
constructing a slip-mode frequency shift (SMS) islanding detection curve in the form of a quadratic function based on the phase information; and
generating a disturbance signal based on the SMS islanding detection curve, and sending the disturbance signal to an inverter of the power generation system.

2. The method of claim 1, wherein the SMS islanding detection curve constructed in the form of the quadratic function is as follows:

$$\theta = \Delta f(a|\Delta f| + b), -M \leq \theta \leq M$$

wherein $\theta$ is the phase of the disturbance signal, $\Delta f = f - f_g$, $f_g$ is a rated frequency of a power grid, f is the frequency of a currently acquired voltage signal, M is the preset maximum amplitude of the disturbance signal, a and b are preset parameters.

3. The method of claim 2, wherein a generated disturbance signal is as follows:

$$(\omega t)' = \omega t + \theta$$

wherein ωt is the extracted phase information, (ωt)' is the generated disturbance signal, θ is the phase of the disturbance signal.

4. The method of claim 3, further comprising:
obtaining a voltage peak and a frequency based on the acquired voltage signal and the extracted phase information;
if the voltage peak of the voltage signal at the grid-connected node exceeds a preset voltage range or if the frequency of the voltage signal at the grid-connected node exceeds a preset frequency range, cutting off a connection between the inverter of the power generation system and a local load.

5. The method of claim 2, wherein $f_g$=50 Hz.

6. The method of claim 5, further comprising:
obtaining a voltage peak and a frequency based on the acquired voltage signal and the extracted phase information;
if the voltage peak of the voltage signal at the grid-connected node exceeds a preset voltage range or if the frequency of the voltage signal at the grid-connected node exceeds a preset frequency range, cutting off a connection between the inverter of the power generation system and a local load.

7. The method of claim 2, further comprising:
obtaining a voltage peak and a frequency based on the acquired voltage signal and the extracted phase information;
if the voltage peak of the voltage signal at the grid-connected node exceeds a preset voltage range or if the frequency of the voltage signal at the grid-connected node exceeds a preset frequency range, cutting off a connection between the inverter of the power generation system and a local load.

8. The method of claim 1, further comprising:
obtaining a voltage peak and a frequency based on the acquired voltage signal and the extracted phase information;
if the voltage peak of the voltage signal at the grid-connected node exceeds a preset voltage range or if the frequency of the voltage signal at the grid-connected node exceeds a preset frequency range, cutting off a connection between the inverter of the power generation system and a local load.

9. The method of claim 8, wherein the preset voltage range is between 0.8V and 1.2V, and the preset frequency range is between 49.5 Hz and 50.5 Hz.

10. An islanding detection system, comprising:
an acquisition module, adapted to acquire a voltage signal at a grid-connected node of a power generation system and to extract phase information of the voltage signal;
an islanding detection module, adapted to construct a slip-mode frequency shift (SMS) islanding detection curve in the form of a quadratic function based on the phase information; and
a drive module, adapted to generate a disturbance signal based on the SMS islanding detection curve, and to send the disturbance signal to an inverter of the power generation system.

11. The system of claim 10, wherein the SMS islanding detection curve constructed by the islanding detection module in the form of the quadratic function is as follows:

$$\theta=\Delta f(a|\Delta f|+b), -M\leq\theta\leq M$$

wherein θ is the phase of the disturbance signal, $\Delta f=f-f_g$, $f_g$ is a rated frequency of a power grid, f is the frequency of a currently acquired voltage signal, M is the preset maximum amplitude of the disturbance signal, a and b are preset parameters.

12. The system of claim 11, wherein a disturbance signal generated by the drive module based on the SMS islanding detection curve is as follows:

$$(\omega t)'=\omega t+\theta$$

wherein ωt is extracted phase information, (ωt)' is the generated disturbance signal, θ is the phase of the disturbance signal.

13. The system of claim 12, wherein the islanding detection module is further adapted to make a decision based on a voltage peak and a frequency that are obtained according to the acquired voltage signal and the extracted phase information, and if the voltage peak of the voltage signal at the grid-connected node exceeds a preset voltage range or if the frequency of the voltage signal at the grid-connected node exceeds a preset frequency range, the islanding detection module is further adapted to cut off a connection between the inverter of the power generation system and a local load.

14. The islanding detection system of claim 12, wherein the acquisition module includes a sensor, a conditioning circuit and a phase-locked loop that are serially connected.

15. The system of claim 11, wherein the islanding detection module is further adapted to make a decision based on a voltage peak and a frequency that are obtained according to the acquired voltage signal and the extracted phase information, and if the voltage peak of the voltage signal at the grid-connected node exceeds a preset voltage range or if the frequency of the voltage signal at the grid-connected node exceeds a preset frequency range, the islanding detection module is further adapted to cut off a connection between the inverter of the power generation system and a local load.

16. The islanding detection system of claim 11, wherein the acquisition module includes a sensor, a conditioning circuit and a phase-locked loop that are serially connected.

17. The system of claim 10, wherein the islanding detection module is further adapted to make a decision based on a voltage peak and a frequency that are obtained according to the acquired voltage signal and the extracted phase information, and if the voltage peak of the voltage signal at the grid-connected node exceeds a preset voltage range or if the frequency of the voltage signal at the grid-connected node exceeds a preset frequency range, the islanding detection module is further adapted to cut off a connection between the inverter of the power generation system and a local load.

18. The islanding detection system of claim 17, wherein the acquisition module includes a sensor, a conditioning circuit and a phase-locked loop that are serially connected.

19. The islanding detection system of claim 10, wherein the acquisition module includes a sensor, a conditioning circuit and a phase-locked loop that are serially connected.

* * * * *

UNITED STATES PATENT AND TRADEMARK OFFICE
CERTIFICATE OF CORRECTION

PATENT NO.       : 9,170,306 B2                                 Page 1 of 1
APPLICATION NO.  : 13/876914
DATED            : October 27, 2015
INVENTOR(S)      : Zheng et al.

It is certified that error appears in the above-identified patent and that said Letters Patent is hereby corrected as shown below:

In the claims
Claim 3, col. 6, line 66, the equation $(\omega t)=\omega t+\theta$ should read $(\omega t)'=\omega t+\theta$
Claim 12, col. 8, line 14, the equation $(\omega t)=\omega t+\theta$ should read $(\omega t)'=\omega t+\theta$ Signed and Sealed this
Nineteenth Day of April, 2016

Michelle K. Lee
*Director of the United States Patent and Trademark Office*